United States Patent [19]

Guyot

[11] Patent Number: 5,798,904
[45] Date of Patent: Aug. 25, 1998

[54] HIGH POWER ELECTROSTATIC CHUCK CONTACT

[75] Inventor: Francois Guyot, Milpitas, Calif.

[73] Assignee: Lam Research Corporation, Fremont, Calif.

[21] Appl. No.: 671,678

[22] Filed: Jun. 28, 1996

[51] Int. Cl.⁶ ................................................. H02N 13/00
[52] U.S. Cl. ............................................................. 361/234
[58] Field of Search ............................ 361/230, 233, 361/234, 235; 279/128

[56] References Cited

U.S. PATENT DOCUMENTS

| | | |
|---|---|---|
| 4,340,462 | 7/1982 | Koch . |
| 4,579,618 | 4/1986 | Celestino et al. . |
| 4,615,755 | 10/1986 | Tracy et al. . |
| 4,665,463 | 5/1987 | Ward et al. . |
| 4,692,836 | 9/1987 | Suzuki . |
| 4,948,458 | 8/1990 | Ogle . |
| 5,013,400 | 5/1991 | Kurasaki et al. . |
| 5,055,964 | 10/1991 | Logan et al. . |
| 5,200,232 | 4/1993 | Tappan et al. . |
| 5,262,029 | 11/1993 | Erskine et al. . |
| 5,326,725 | 7/1994 | Sherstinsky et al. . |

*Primary Examiner*—Fritz Fleming
*Attorney, Agent, or Firm*—Burns, Doane, Swecker & Mathis, L.L.P.

[57] ABSTRACT

In a vacuum processing chamber, an exemplary electrical contact assembly between an electrostatic chuck and a voltage source comprises a flexible wire connected at one end to the underside of the electrostatic chuck and at the other end to a conductive socket fixed in the electrode cap. An electrical contacting member which is connected to the voltage source is removably received into the socket so that the electrode cap can be replaced by lifting the electrode cap and socket off of the contacting member which is fixed in the electrode base.

23 Claims, 7 Drawing Sheets

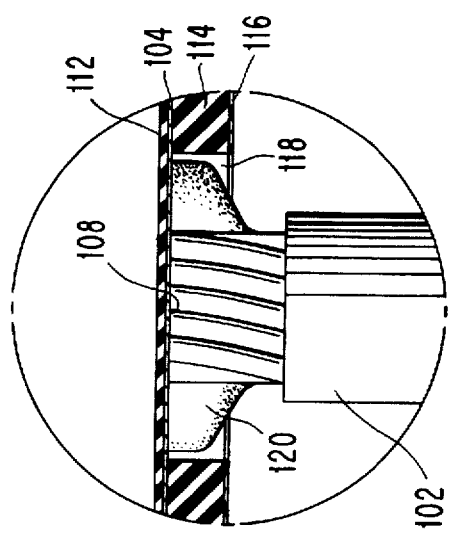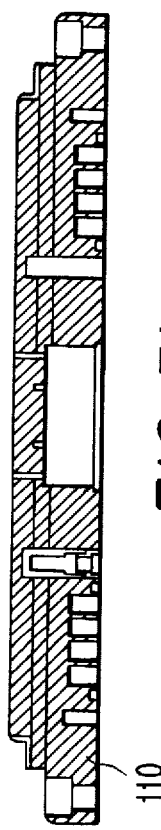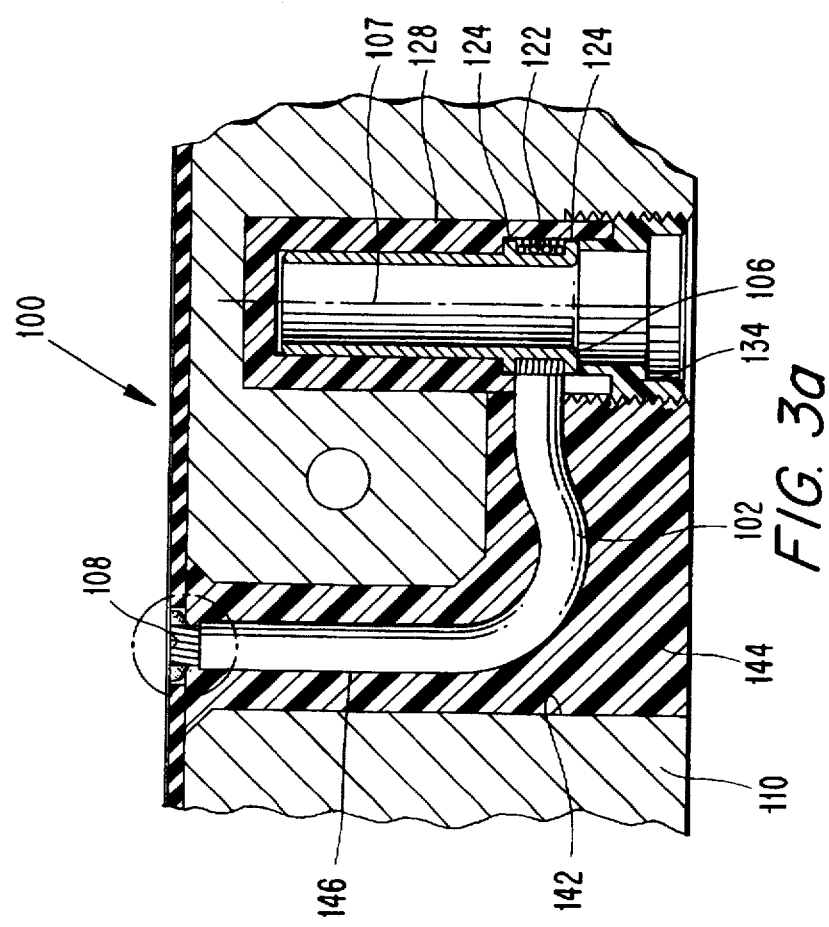

HIGH POWER ELECTROSTATIC CHUCK CONTACT

FIELD OF THE INVENTION

The present invention relates generally to an electrostatic chuck for holding a substrate in a vacuum processing chamber, and more particularly to an electrical contact for supplying power to an electrostatic chuck which allows the electrostatic chuck to be removed.

BACKGROUND OF THE INVENTION

Vacuum processing chambers are generally used for etching and chemical vapor deposition (CVD) of materials on substrates by supplying an etching or deposition gas to the vacuum chamber and application of an RF field to the gas. Examples of parallel plate, transformer coupled plasma (TCP), and electron-cyclotron resonance (ECR) reactors are disclosed in commonly owned U.S. Pat. Nos. 4,340,462; 4,948,458; and 5,200,232. The substrates are held in place within the vacuum chamber during processing by substrate holders. Conventional substrate holders include mechanical clamps and electrostatic chucks (ESC). Examples of mechanical clamps and ESC substrate holders are provided in commonly owned U.S. Pat. No. 5,262,029 and commonly owned U.S. application Ser. No. 08/401,524 filed on Mar. 10, 1995. Substrate holders in the form of an electrode can supply radio frequency (RF) power into the chamber, as disclosed in U.S. Pat. No. 4,579,618.

Mechanical clamps generally employ a clamp ring which surrounds the substrate and presses down on the top surface of the substrate around its periphery. Further examples of mechanical clamping rings are disclosed in U.S. Pat. Nos. 4,615,755; 5,013,400; and 5,326,725. Due to the fact that these known mechanical clamps cover the edge portions of the substrate, mechanical clamps reduce the area of the substrate which is able to be processed. Some additional drawbacks of mechanical clamps are that the clamp ring may cause damage to the edge of the substrate or may cause particles to become dislodged and contaminate the substrate in the chamber. In addition, although mechanical clamps are suitable for use in many applications with small substrates, when large substrates such as flat panel displays are processed using mechanical clamps, the panels may have a tendency to become bowed due to the supply of pressurized gas used for increasing thermal conduction between the substrate and the water cooled substrate holder.

Electrostatic chucks are used for holding substrates (e.g., semiconductor wafers, flat panel display substrates, etc.) in place in a vacuum chamber in situations where it is desirable to avoid a clamping ring which extends over a portion of the substrate upper surface. Rather than mechanically clamping an article to the chuck, electrostatic chucks employ the attractive coulomb force between oppositely charged surfaces to clamp the article to the chuck. Electrostatic chucks of the monopolar type utilize a single electrode. The single electrode, separated from the wafer by a dielectric material, is biased with an AC or DC power supply. The article to be clamped acts as a second electrode and, together with the intervening dielectric and the first electrode, forms a parallel plate capacitor. The electrostatic force between the article and the chuck is proportional to the square of the voltage between them, proportional to the dielectric constant of the dielectric medium separating them, and inversely proportional to the square of the distance between them. U.S. Pat. No. 4,665,463 discloses an example of a monopolar electrostatic chuck.

FIG. 1 shows the operation of a typical bipolar electrostatic chuck. Electrostatic chucks of the bipolar type utilize mutual attraction between polarized electrodes which are separated by a dielectric layer. For instance, see U.S. Pat. Nos. 4,692,836 and 5,055,964. As shown in FIG. 1, a series of interdigitated electrodes 42 and 44 are disposed within an encapsulating layer 32 of dielectric material. The electrodes 42 and 44 rest on a base dielectric layer 30. By application of a voltage between the electrodes 42 and 44, e.g., applying voltages of opposite polarities to the two electrodes, electric fields 48 are created which intercept the wafer 14. In a bipolar electrostatic chuck, the attractive force is produced between polarized charges, i.e., the charge induced on the material to be chucked and the charge on the electrodes, to electrostatically clamp the wafer 14 to the dielectric material 32 by the Johnsen-Rahbek effect.

To supply power to the electrodes of the electrostatic chuck, typically wires or cables are run from the electrodes through the electrode cap to the voltage source which supplies the voltage. FIG. 2, for example, shows an electrode cap 50 having an electrostatic chuck 52 sandwiched between two dielectric layers 54 and 56. A multi stranded wire 58 is connected to the electrostatic chuck 52 with a solder joint 60. The wire 58 passes through the electrode cap 50 and may be insulated from the conductive electrode cap 50 with a suitable insulator 62. The other end of the wire 58 is connected to the voltage source.

While the system shown in FIG. 2 operates adequately to supply power from a remote source to the electrostatic chuck 52, if any problems with the electrostatic chuck 52 arise or if a different electrostatic chuck is desired for a particular application, it is costly and difficult to replace the electrostatic chuck 52 which is sandwiched between two dielectric layers in the electrode cap and hard-wired to the voltage source. Such replacement typically encompasses a teardown of the system resulting in significant down-time. In addition, the arrangement shown in FIG. 2 utilizes a relatively long wire 58 to supply power to the electrostatic chuck 52 which limits the amount of power which may be supplied to the electrostatic chuck 52.

SUMMARY OF THE INVENTION

According to an exemplary embodiment of the present invention, a high power electrostatic chuck contact is provided. The contact may be housed within the electrode cap of a vacuum processing chamber and may include a socket which is electrically connected to an electrode of the electrostatic chuck with flexible wire which extends from the electrostatic chuck to the socket. The wire and the socket may be electrically insulated from the electrode cap. A contacting member is provided on the electrode base of the vacuum processing chamber to supply power to the electrostatic chuck via the socket. The contacting member may thus be connected at one end to a DC and/or an RF power source. The other end of the contacting member is received in the socket of the electrode cap. Because the contacting member is easily removed from the socket, the electrode cap, which houses the electrostatic chuck, is easily removed from the electrode base.

According to another aspect of the present invention, the socket can be made to have a relatively large surface area for receiving the contacting member, the wire connecting the socket and the electrostatic chuck may contact the socket over a large surface area, and the wire connecting the socket and the electrostatic chuck may have a relatively short length. This configuration provides the additional advantage that RF energy can be coupled to a plasma, for example, through the electrostatic chuck, rather than through the electrode cap, which allows a lesser RF power to be used since the RF power is closer to the plasma and does not pass through a thick dielectric layer.

An exemplary electrostatic chuck for a vacuum chamber thus comprises an electrode for clamping an article to the electrostatic chuck, a wire having a first end connected to the electrode, and a conductive socket connected to a second end of the wire, the conductive socket adapted to receive power through a removable electrical contacting member.

An exemplary method of assembling an electrostatic chuck used to support substrates in a vacuum processing chamber comprises the steps of slidably attaching a removable cap including an electrostatic chuck and a first electrical contacting member to a support member including a second electrical contacting member such that the first and second contacting members are electrically connected together, and securing the cap to the support member with at least one fastening member.

BRIEF DESCRIPTION OF THE DRAWINGS

The foregoing and other objects, features, and advantages of the present invention will be more readily understood upon reading the following detailed description in conjunction with the drawings in which:

FIGS. 3a, 3b and 3c show a novel electrical connector according to an exemplary embodiment of the invention;

FIG. 4 shows the conductive socket of FIG. 3a;

FIGS. 6a and 6b show the insulating cup of FIG. 3a;

FIGS. 7a and 7b show the socket nut which retains the socket in FIG. 3a;

DETAILED DESCRIPTION OF THE PREFERRED EMBODIMENTS

Figure 1:
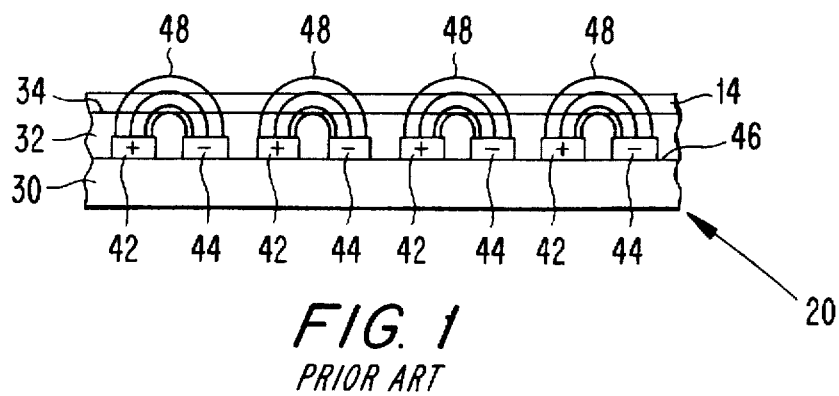
FIG. 1 shows a side view of the electric field lines of an electrostatic chuck.
Figure 2:
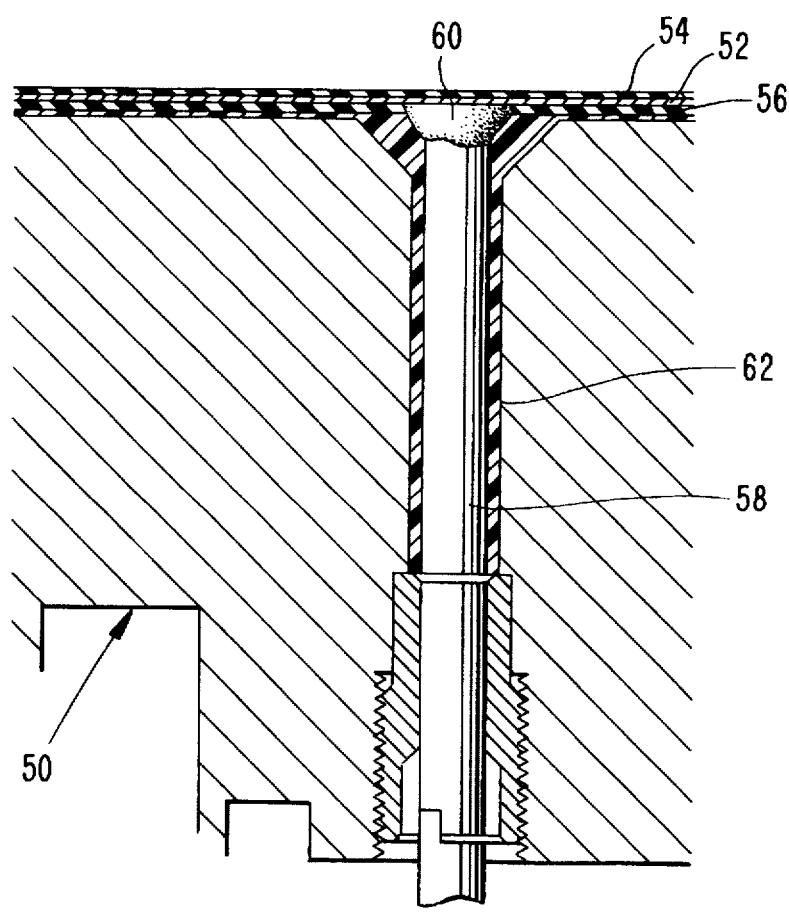
FIG. 2 shows a conventional apparatus for providing a voltage to an electrostatic chuck.

FIGS. 3a–3c show an electrical contact assembly 100 according to an exemplary embodiment of the invention. The contact assembly 100 generally comprises a wire or cable 102 which is connected between an electrostatic chuck 104 and an electrical socket 106. The contact assembly 100 may be housed within the electrode cap 110 of a vacuum processing chamber.

The electrostatic chuck 104 is preferably of the monopolar or bipolar variety and may include one or more electrodes which produce a coulomb attractive force on a substrate to be supported within the vacuum chamber. The electrodes may be sandwiched between an upper dielectric layer 112 and a lower dielectric layer 114 which insulate the electrodes from the electrode cap 110 and from the substrate to be supported. A thin silicone RTV layer 116 may be formed below the lower dielectric layer 114 to bond the lower dielectric layer to the electrode cap 110.

As shown in FIG. 3c, a first end 108 of the wire 102 is connected to an electrode of the electrostatic chuck 104. In a bipolar electrostatic chuck, a first contact assembly 100 may be provided for one of the electrodes (e.g., the positive electrode) and a second contact assembly 100 may be provided for the opposite electrode (e.g., the negative electrode). In addition, it is possible to use more than two contact assemblies 100 to supply power to the electrodes of the electrostatic chuck. To provide access to the electrodes, a recess 118 is formed in the bottom dielectric layer 114 and silicone RTV layer 116 where the connection is to be made. The wire 102 can then be electrically connected to the electrode by any suitable method, for example with a solder joint 120.

The combined thickness of the electrostatic chuck 104 and upper dielectric layer 112 can be as small as 0.15 millimeter, which makes the structure very fragile. To reduce the likelihood of damaging the electrostatic chuck 104 and upper dielectric layer 112, it is preferable that the wire 102 be relatively flexible. A flexible wire reduces the amount of stress that may be applied to the electrostatic chuck 104 by the wire through handling, thermal cycling, etc.

Figure 4:
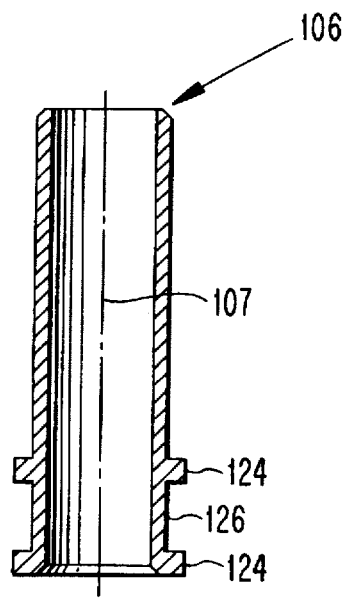

A second end 122 of the wire 102 is electrically connected to the socket 106. The socket 106, which is shown in greater detail in FIG. 4, may include parallel flanges 124 which extend outward from the socket 106. The flanges 124 define an area 126 between them in which the cable 102 is connected. The cable 102 may thus be wrapped around the socket 106 in the connection area 126 which provides an electrical connection adequate for powering the electrostatic chuck 102 to clamp an article.

According to a preferred embodiment, the socket 106 has a relatively large surface area and the cable 102 contacts the socket over a relatively large surface area. In addition, the cable 102 preferably has a relatively short length, e.g., 1.5 inches and a relatively large diameter, e.g., 0.09 inches. This exemplary configuration allows high power RF energy to be coupled to the plasma through the electrostatic chuck rather than through the electrode cap 110 and provides the advantage that a reduced RF power can be used because there is significantly less dielectric material between the electrostatic chuck and the article than between the electrode cap 110 and the article. Therefore, less RF power is required because it is not necessary to power the RF energy from the electrode cap through a significant amount of dielectric material. According to one embodiment of the invention, the RF energy coupled through the electrostatic chuck is RF bias energy which controls, for example, the ion energy in the plasma. The plasma density may be controlled independently with a separate RF source.

Figure 5:
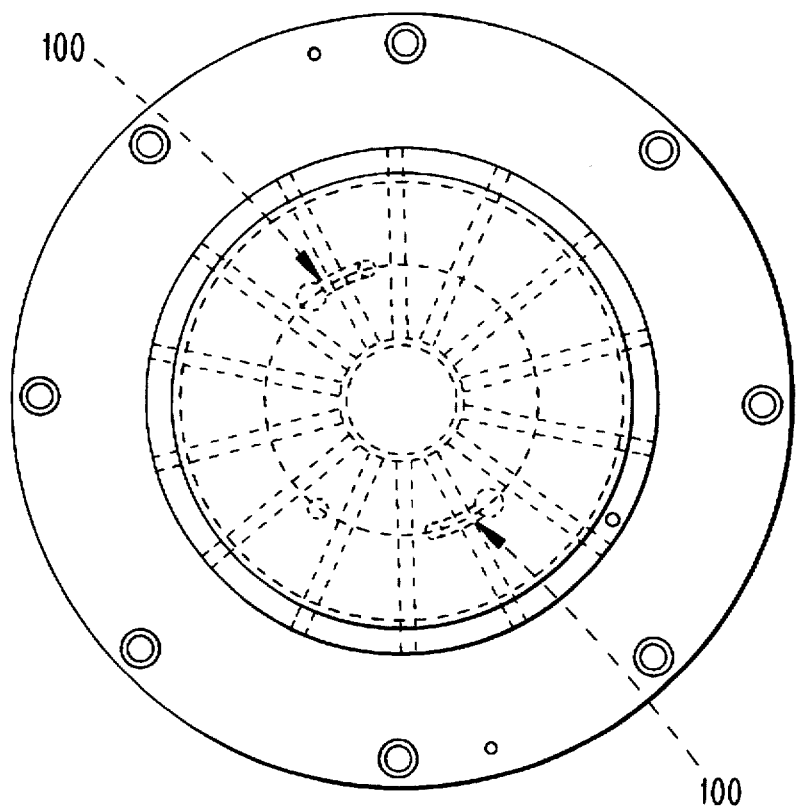
FIG. 5 is a top view of an electrode cap which includes electrical contact assemblies according to an exemplary embodiment of the invention.

The end 108 of the cable 102 which is connected to the electrostatic chuck 104 is preferably offset from a longitudinal axis 107 of the socket 106 according to an exemplary embodiment of the invention. A top view of the electrode cap 110 which shows this configuration is illustrated in FIG. 5. In FIG. 5, two contact assemblies 100 are shown from above in which the location of the connection of the wire to the electrostatic chuck 104 is offset from the central axis 107 of the socket 106.

Figure 6A:
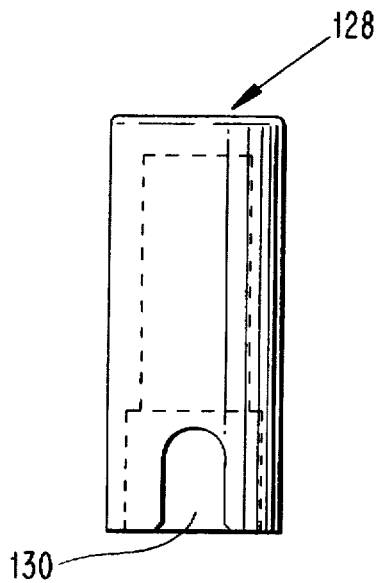
Figure 6B:
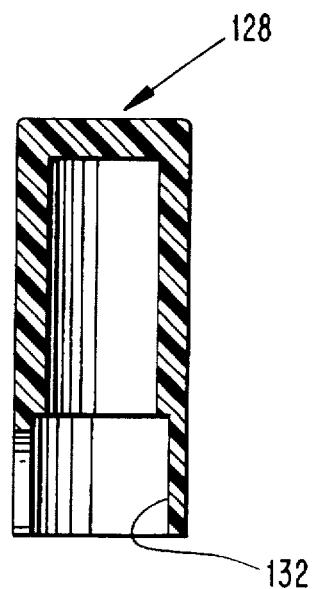

The socket 106, which may be made of brass or any other suitable conductor, is fitted securely within a cup 128 shown in greater detail in FIGS. 6a and 6b. The cup 128 provides a cavity to receive the socket 106 and is preferably formed of an insulative material to insulate the socket 106 from the electrode cap 110. For example, the cup 128 may be formed of TORLON, a 30% glass filed polyamideamide according to an exemplary embodiment of the invention. To receive the cable 102, the cup 128 may have an opening 130 which is adjacent to the connection area 126 of the socket 106. The interior diameter of the cup 128 may be enlarged at a lower portion 132 to accommodate the flanges 124 and connection area 126 of the socket 106. When the cable 102 is connected to the socket 106, the cable is disposed within an annular space defined on the outside by the cup 128 and on the inside by the connection area 126 between the two flanges 124.

Figure 7A:
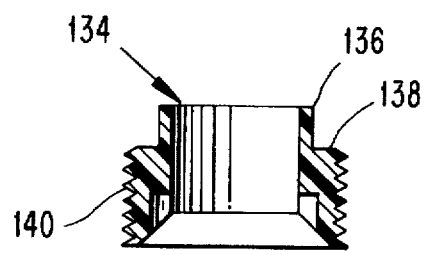
Figure 7B:
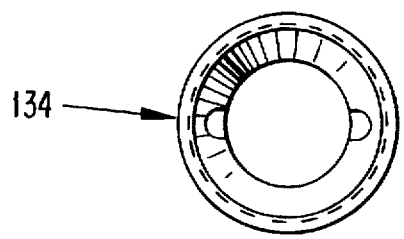

The cup 128 and the socket 106 may be secured in the electrode cap 110 by means of a socket nut 134. As shown in greater detail in FIGS. 7a and 7b, the socket nut 134 provides a first abutting surface 136 which maintains the socket 106 within the cup 128 as well as a second abutting surface 138 which retains the cup 128 in the electrode cap 110. The socket nut 134 can have outer threads 140 so that it can be screwed into corresponding inner threads in the electrode cap 110. The socket nut 134 thus provides a secure attachment of the socket 106 and insulating cup 128 in the electrode cap 110. The socket nut 134 is preferably formed of an insulator such as TORLON.

To maintain the position of the wire 102 with respect to the electrostatic chuck 104 and to insulate the wire 102, the electrode cap 110 may include a cavity 142 filled with an insulator 144 such as epoxy, as shown in FIG. 3a. The insulator 144 encapsulates the wire 102 which fixes the position of the wire 102 with respect to the electrostatic chuck 104, thus preventing the wire 102 from exerting any stress on the electrostatic chuck 104. To further insulate the wire 102, an insulating sheath 146 can be formed around the wire 102. The insulating sheath 146 preferably has a high breakdown voltage to prevent a discharge to the electrode cap 110, for example.

Figures 8A, 8B:
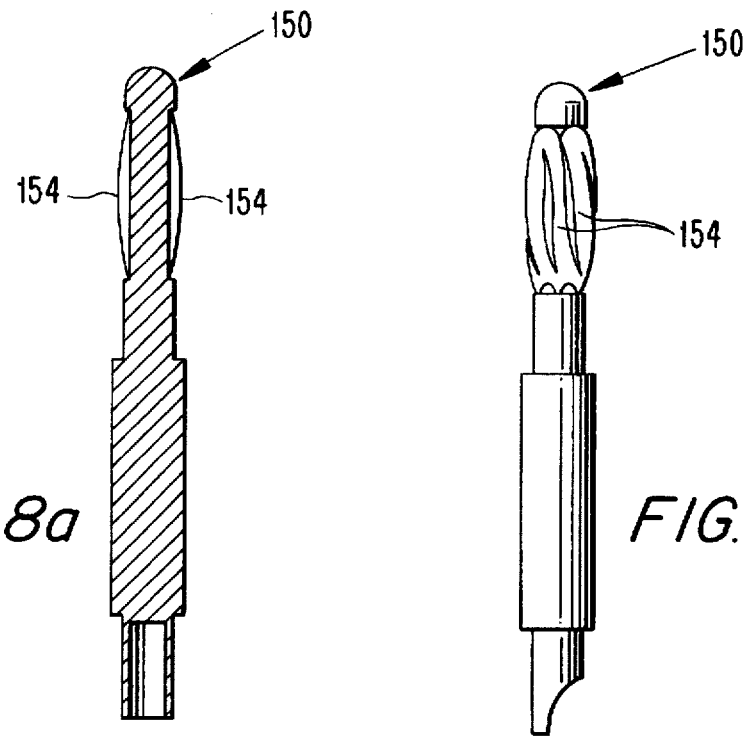
FIGS. 8a and 8b show a contacting member which is received into the socket according to an exemplary embodiment of the invention.

FIGS. 8a and 8b show an exemplary contacting member 150 which is received into the socket 106 to provide power to the electrostatic chuck 104. One end of the contacting member 150 is connected to a DC voltage source which supplies power to the electrostatic chuck 104 to create the electrostatic clamping force. In addition, an RF bias source may be coupled to the contacting member so that the electrostatic chuck 104, rather than the electrode cap, provides at least a portion of the RF bias energy to the vacuum chamber. The RF bias source may be isolated from the DC voltage source with a conventional coupling capacitor.

The other end of the contacting member 150 makes contact with the inside surface of the socket 106. According to a preferred embodiment, the contacting member includes contacts 154 which are flexible and which bow outwardly from the contacting member 150. Preferably, the contacts 154 bow outwardly to form a diameter which is greater than the inner diameter of the socket 106. In this way, the contacts 154 are forced inward when the contacting member 150 is inserted into the socket 106, which results in a good electrical connection between the contacting member 150 and the inside of the conductive socket 106.

Figure 9:
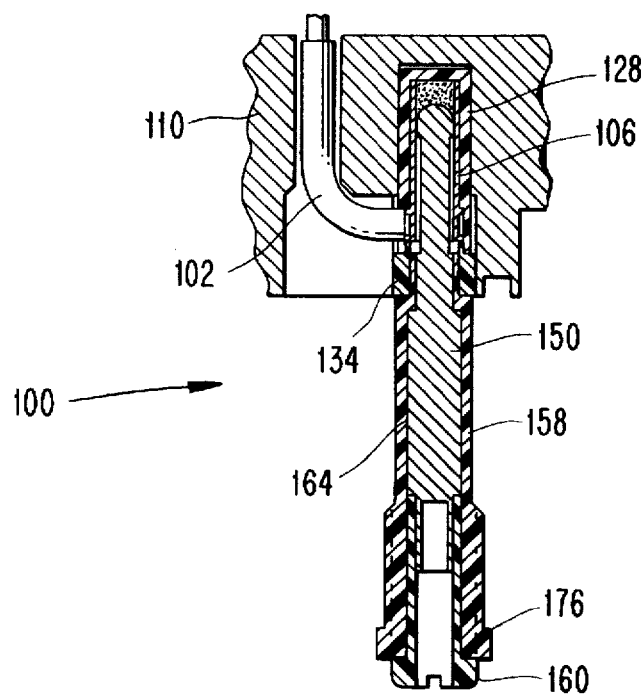
FIG. 9 shows the electrical connector of FIG. 3a into which a contacting member has been inserted.
Figure 10A:
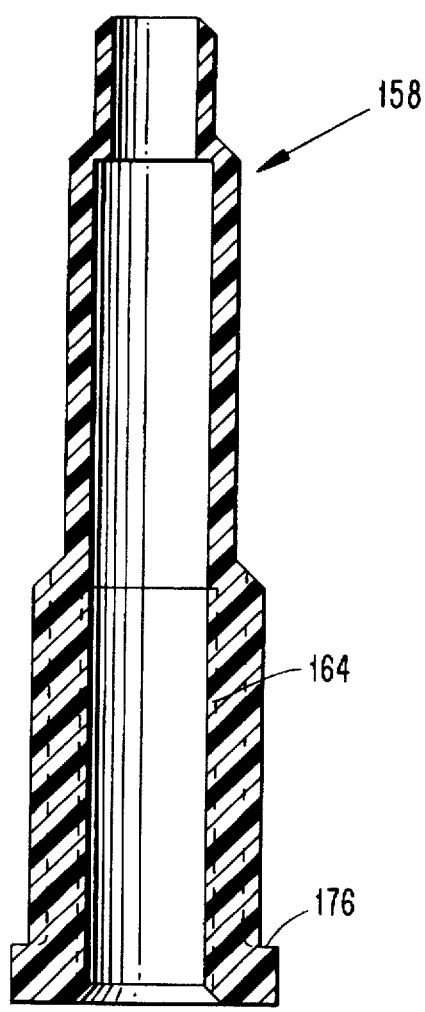
FIGS. 10a and 10b show the bushing of FIG. 9.
Figure 11A:
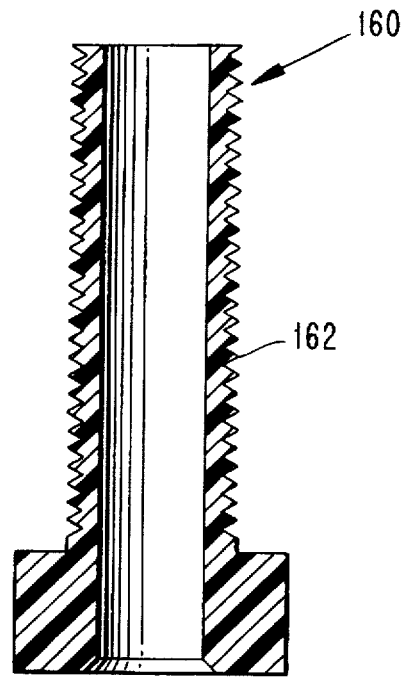
FIGS. 11a and 11b show the retaining screw of FIG. 9 which retains the contacting member within the bushing according to an exemplary embodiment of the invention.
Figure 10B:
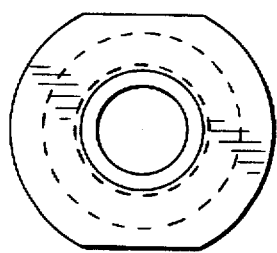
Figure 11B:
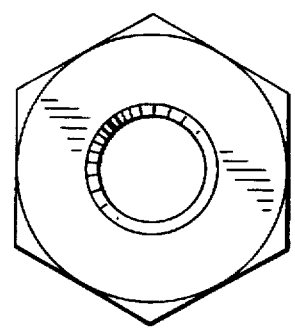

FIG. 9 shows the contact assembly 100 with the contacting member 150 inserted into the socket 106. In this position, the contacts 154 of the contacting member 150 (see FIG. 8b) are forced inward by the inside surface of the socket 106. The contacting member 150 may be provided with a bushing 158, shown in greater detail in FIGS. 10a and 10b, which insulates a lower portion of the contacting member 150. The bushing 158 may be formed of an insulator such as TORLON. The contacting member 150 may be secured within the bushing 158 by means of a retaining screw 160, which is shown in greater detail in FIGS. 11a and 11b. The retaining screw 160 may have outer threads 162 which are screwed into corresponding inner threads 164 on the bushing 158. The retaining screw 160 may be formed of NYLON or other suitable material.

Figure 12:
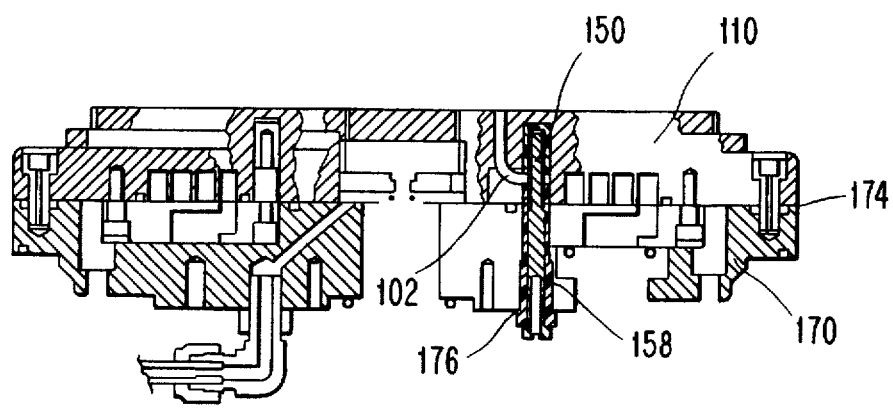
FIG. 12 shows an exemplary electrical contact assembled within an electrode cap and an electrode base.

The bushing 158, because it is preferably formed of an insulating material, insulates the contacting member 150 from the base 170 of the electrode, as best shown in FIG. 12. FIG. 12 also shows the dividing line 174 between the electrode cap 110 and the electrode base 170. The electrode cap 110, which houses the electrostatic chuck 104, can be removed from the electrode base 170 because the contacting member 150 is easily removable from the socket 106. FIG. 9 further shows that the bushing 158 has a shoulder 176 which abuts the bottom of the electrode base 170 so that if the electrode cap 110 is removed, the shoulder 176 of the bushing 158 retains the bushing 158 (and contacting member 150) in the electrode base 170. The contacting member 150 then projects upward from the electrode base 170 to be plugged into a conductive socket on a replacement electrode cap. Because the electrode cap 110 and the electrostatic chuck 104 are removable from the electrode base 170, it is easy to replace the electrode cap and electrostatic chuck without the need for a system teardown. This provides a great advantage, for example, if the fragile electrostatic chuck becomes damaged or if a certain electrostatic chuck is desired for a particular process. In addition, because the contact arrangement between the electrostatic chuck and the power source is configured to allow high power RF energy to be coupled through the electrostatic chuck, exemplary embodiments of the present invention provide the additional advantage that the RF power can be reduced since it is closer to the plasma and does not pass through a significant amount of dielectric material.

As will be readily appreciated by those skilled in the art, the electrical contact assembly according to exemplary embodiments of the present invention can provide enormous cost and time savings in the event that an electrostatic chuck needs to be replaced. Rather than undergoing a system teardown, the damaged electrostatic chuck can simply be unplugged from the electrode base and a replacement electrode cap plugged into the electrode base. Also, by utilizing a relatively flexible cable to connect the electrostatic chuck to the socket, the possibility of a damaging stress being applied to the underside of the fragile electrostatic chuck can be minimized. In addition, the dimensions of the contact assembly, e.g., the wire and socket, can be advantageously configured to allow high power RF energy to be coupled to a plasma, for example, through the electrostatic chuck rather than the electrode cap, which provides a significant savings in power consumption.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. An electrostatic chuck for a vacuum processing chamber comprising:
   an electrode for clamping an article to the electrostatic chuck;
   a wire having a first end connected to the electrode; and
   a conductive socket connected to a second end of the wire, the conductive socket adapted to receive power through a removable electrical contacting member.

2. The electrostatic chuck of claim 1, wherein the socket has a surface area sufficient to receive power from an RF bias source to provide an RF bias in the vacuum processing chamber.

3. The electrostatic chuck of claim 1, wherein the wire is flexible.

4. The electrostatic chuck of claim 1 wherein the wire has a length which is sufficiently short to allow RF bias power to be transmitted through the electrostatic chuck.

5. The electrostatic chuck of claim 1, wherein a point at which the wire is connected to the electrode is offset from a longitudinal axis of the conductive socket.

6. The electrostatic chuck of claim 1, wherein the socket comprises brass.

7. An electrostatic chuck for a vacuum processing chamber comprising:
   an electrode for clamping an article to the electrostatic chuck;
   a wire having a first end connected to the electrode; and
   a conductive socket connected to a second end of the wire, the conductive socket adapted to receive power through a removable electrical contacting member, wherein the conductive socket is adapted to provide a friction fit with the removable electrical contacting member.

8. A vacuum processing chamber comprising:
   an electrostatic chuck;
   a cable connected at a first end to the electrostatic chuck for supplying power to the electrostatic chuck;
   a socket having an inside surface which is electrically connected to a second end of the cable; and
   a contacting member which is removably received into the socket, wherein the electrical contacting member slides against the inside surface of the socket to make electrical contact with the inside surface of the socket to supply power to the electrostatic chuck.

9. The vacuum processing chamber of claim 8, wherein the cable is flexible so as to prevent damage to the electrostatic chuck.

10. The vacuum processing chamber of claim 8, wherein the socket comprises brass.

11. The vacuum processing chamber of claim 8, wherein the cable is surrounded by epoxy to electrically insulate the cable.

12. The vacuum processing chamber of claim 8, wherein the socket has a surface area sufficient to receive RF power from an RF source.

13. The vacuum processing chamber of claim 8, wherein the contacting member produces a friction fit with the socket.

14. The vacuum processing chamber of claim 8, wherein a point at which the cable connects to the electrostatic chuck is offset from a longitudinal axis of the socket.

15. The vacuum processing chamber of claim 8, wherein the cable has a length which is sufficiently short to allow RF bias energy to be transmitted through the electrostatic chuck.

16. An electrical connector for an electrostatic chuck comprising:
   a cable having a first end electrically connected to the electrostatic chuck;
   a socket including a side wall, said side wall electrically connected to a second end of the cable; and
   an electric contacting member for supplying power to the socket, wherein said contacting member is removably received into the socket to make electrical contact with said side wall of the socket.

17. The electrical connector of claim 16, wherein the cable is flexible to prevent damage to the electrostatic chuck.

18. The electrical connector of claim 16, wherein the socket has a surface area sufficient to receive RF power from an RF source and to transmit the RF power through the electrostatic chuck.

19. A method of assembling an electrostatic chuck in a vacuum processing chamber comprising the steps of:
   slidably attaching a removable cap including an electrostatic chuck and a first electrical contacting member to a support member including a second electrical contacting member such that the first and second contacting members are electrically connected together; and
   securing the cap to the support member with at least one fastening members, wherein the first electrical contacting member comprises an electrically conductive socket and the second electrical contacting member comprises a contact extending outwardly away from a surface of the support member which faces the cap, the contact being frictionally engaged with the socket during the attaching step.

20. The method of claim 19, wherein the at least one fastening member comprises a plurality of bolts, the bolts being tightened during the securing step.

21. A method of assembling an electrostatic chuck in a vacuum processing chamber comprising the steps of:
   slidably attaching a removable cap including an electrostatic chuck and a first electrical contacting member to a support member including a second electrical contacting member such that the first and second contacting members are electrically connected together; and
   securing the cap to the support member with at least one fastening member, wherein the first electrical contacting member comprises a plurality of sockets and the second electrical contacting member comprises a plurality of contacts extending outwardly away from a surface of the support member which faces the cap, the contacts being frictionally engaged with the sockets during the attaching step.

22. The method of claim 19, further comprising clamping a substrate on the electrostatic chuck and applying an RF bias to the substrate by supplying DC current and RF power to the electrostatic chuck through the first and second electrical contacting members.

23. An electrostatic chuck for a vacuum processing chamber comprising:
   an electrode for clamping an article to the electrostatic chuck;
   a wire having a first end connected to the electrode; and
   a conductive socket including at least a side wall, wherein at least a first electrical contacting member connects a second end of the wire to said sidewall, and said electrode receives power through a removable second electrical contacting member via said side wall of the conductive socket.

* * * * *